(12) United States Patent
Lee et al.

(10) Patent No.: US 8,759,822 B2
(45) Date of Patent: Jun. 24, 2014

(54) ORGANIC LIGHT-EMITTING DISPLAY APPARATUS AND METHOD OF MANUFACTURING THE SAME

(71) Applicant: Samsung Display Co. Ltd., Yongin-si (KR)

(72) Inventors: Young-Sahn Lee, Yongin-si (KR); Gun-Shik Kim, Yongin-si (KR); Young-Mi Cho, Yongin-si (KR); Kyung-Chan Chae, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 27 days.

(21) Appl. No.: 13/678,473

(22) Filed: Nov. 15, 2012

(65) Prior Publication Data

US 2014/0027722 A1    Jan. 30, 2014

(30) Foreign Application Priority Data

Jul. 24, 2012    (KR) .................. 10-2012-0080802

(51) Int. Cl.
- H01L 29/08    (2006.01)
- H01L 35/24    (2006.01)
- H01L 51/00    (2006.01)

(52) U.S. Cl.
USPC ........................................................ 257/40

(58) Field of Classification Search
USPC ................................................... 257/98, 88
See application file for complete search history.

(56) References Cited

U.S. PATENT DOCUMENTS

| | | | |
|---|---|---|---|
| 6,872,473 B2 | 3/2005 | Song et al. | |
| 7,648,925 B2 | 1/2010 | Moro et al. | |
| 8,574,662 B2 * | 11/2013 | Lee | 427/66 |
| 2001/0044035 A1 | 11/2001 | Morii | |
| 2011/0114992 A1 * | 5/2011 | Schmid et al. | 257/100 |
| 2011/0121354 A1 * | 5/2011 | Schmid et al. | 257/100 |
| 2012/0098022 A1 * | 4/2012 | Jan et al. | 257/99 |

FOREIGN PATENT DOCUMENTS

| | | |
|---|---|---|
| JP | 2003-068447 | 3/2003 |
| KR | 10-2000-0071821 | 11/2000 |
| KR | 2001-0092414 | 10/2001 |

* cited by examiner

*Primary Examiner* — Dao H Nguyen
*Assistant Examiner* — Tram H Nguyen
(74) *Attorney, Agent, or Firm* — Christie, Parker & Hale, LLP

(57) ABSTRACT

An organic light-emitting display apparatus including a substrate; an organic light-emitting device formed on the substrate; a thin film encapsulation layer that is formed on the organic light-emitting device and covers the organic light-emitting device; and a barrier layer disposed between the organic light-emitting device and the thin film encapsulation layer, in which the barrier layer includes a first barrier layer formed on the organic light-emitting device and including an alkali metal-containing compound; and a second barrier layer disposed between the first barrier layer and the thin film encapsulation layer and including an amorphous inorganic oxide.

26 Claims, 12 Drawing Sheets

ORGANIC LIGHT-EMITTING DISPLAY APPARATUS AND METHOD OF MANUFACTURING THE SAME

CROSS-REFERENCE TO RELATED PATENT APPLICATION

This application claims priority to and the benefit of Korean Patent Application No. 10-2012-0080802, filed on Jul. 24, 2012, in the Korean Intellectual Property Office, the disclosure of which is incorporated herein in its entirety by reference.

BACKGROUND

1. Field

The present invention relates to an organic light-emitting display apparatus and a method of manufacturing the same.

2. Description of the Related Art

Organic light-emitting display apparatuses include an organic light-emitting device including a hole injection electrode, an electron injection electrode, and an organic emission layer formed therebetween, and are self-emissive display apparatuses that generate light when excitons that are generated by combining holes injected from the hole injection electrode and electrons injected from the electron injection electrode in the organic emission layer drop to a ground state from an excited state.

Since the organic light-emitting display apparatuses are self-emissive display apparatuses that do not require a separate light source, the organic light-emitting display apparatuses are driven at a low voltage, are thinned and lightweight, and have desired properties such as wide viewing angles, an excellent contrast ratio, and fast response times, and thus, are regarded as next-generation displays.

However, an organic light-emitting display apparatus deteriorates due to external moisture, oxygen, or the like, and thus, an organic light-emitting device needs to be sealed in order to protect the organic light-emitting device from external moisture, oxygen, or the like. In this case, during the sealing of the organic light-emitting device, the organic light-emitting device is prevented from being damaged.

SUMMARY

Aspects of embodiments of the present invention are directed toward an organic light-emitting display apparatus and a method of manufacturing the same.

According to an embodiment of the present invention, there is provided an organic light-emitting display apparatus including a substrate; an organic light-emitting device formed on the substrate; a thin film encapsulation layer that is formed on the organic light-emitting device and covers the organic light-emitting device; and a barrier layer disposed between the organic light-emitting device and the thin film encapsulation layer, wherein the barrier layer includes: a first barrier layer formed on the organic light-emitting device and including an alkali metal-containing compound; and a second barrier layer disposed between the first barrier layer and the thin film encapsulation layer and including an amorphous inorganic oxide.

The second barrier layer may be disposed directly below the thin film encapsulation layer such that an upper surface of the second barrier layer directly contacts a lower surface of the thin film encapsulation layer.

The second barrier layer may be formed directly on the first barrier layer.

The first barrier layer may include lithium fluoride (LiF).

The second barrier layer may include at least one selected from the group consisting of SiO, $TiO_x$, $MoO_x$, ZnO, $ZnSnO_x$, and $AlO_xN_y$.

The second barrier layer may have a region having a higher concentration of oxygen than other regions thereof.

The thin film encapsulation layer may include a plurality of inorganic layers and organic layers formed between the plurality of inorganic layers, and the inorganic layers may include an inorganic oxide.

A lowermost layer of the thin film encapsulation layer may be an inorganic layer of the inorganic layers, and the second barrier layer may be formed below the inorganic layer.

The organic light-emitting display apparatus may further include a third barrier layer formed directly below at least one of the plurality of inorganic layers and including an alkali metal-containing compound; and a fourth barrier layer formed on the third barrier layer and including an amorphous inorganic oxide.

The first barrier layer may have a thickness of about 100 Å to about 3000 Å.

The second barrier layer may have a thickness of about 10 Å to about 100 Å.

According to another embodiment of the present invention, there is provided an organic light-emitting display apparatus including a substrate; a first electrode formed on the substrate; an organic light-emitting device formed on the first electrode; a second electrode formed on the organic light-emitting device; a thin film encapsulation layer that is formed on the second electrode so as to cover the first electrode, the organic light-emitting device, and the second electrode, and includes inorganic layers and organic layers disposed between the inorganic layers; and a barrier layer disposed below the inorganic layer, wherein the barrier layer includes: a first barrier layer including an alkali metal-containing compound; and a second barrier layer disposed between the first barrier layer and the inorganic layer and including an amorphous inorganic oxide.

The first barrier layer may include LiF.

The second barrier layer may include at least one selected from the group consisting of SiO, $TiO_x$, $MoO_x$, ZnO, $ZnSnO_x$, and $AlO_xN_y$.

The second barrier layer may have a region having a higher concentration of oxygen than other regions thereof.

The second barrier layer may be formed directly below the inorganic layer, and the inorganic layer may include an inorganic oxide.

The second barrier layer may have a thickness of about 10 Å to about 100 Å.

According to another embodiment of the present invention, there is provided a method of manufacturing an organic light-emitting display apparatus, the method including forming an organic light-emitting device on a substrate; forming a thin film encapsulation layer to cover the organic light-emitting device; and forming a barrier layer between the organic light-emitting device and the thin film encapsulation layer, wherein the forming of the barrier layer includes forming a first barrier layer including an alkali metal-containing compound on the organic light-emitting device; and forming a second barrier layer including an amorphous inorganic oxide between the first barrier layer and the thin film encapsulation layer.

The forming of the thin film encapsulation layer may include forming an inorganic layer including an inorganic oxide; and forming an organic layer on the inorganic layer.

The inorganic layer may be formed via plasma deposition or atomic layer deposition (ALD).

The first barrier layer may include lithium fluoride (LiF).

The forming of the first barrier layer may utilize a thermal evaporation process.

The second barrier layer may include at least one selected from the group consisting of SiO, $TiO_x$, $MoO_x$, ZnO, $ZnSnO_x$, and $AlO_xN_y$.

The forming of the second barrier layer may utilize a thermal evaporation process.

The first barrier layer may have a thickness of about 100 Å to about 3000 Å.

The second barrier layer may have a thickness of about 10 Å to about 100 Å.

BRIEF DESCRIPTION OF THE DRAWINGS

The above and other features and advantages of the present invention will become more apparent by describing in detail exemplary embodiments thereof with reference to the attached drawings in which:

FIG. 6A is a graph showing a change in energy of oxygen atoms introduced into a barrier layer formed of LiF and a second barrier layer formed of SiO, and FIG. 6B is a graph showing a depth to which the oxygen atoms penetrate into the barrier layer formed of LiF and the second barrier layer formed of SiO;

DETAILED DESCRIPTION

Figure 1:
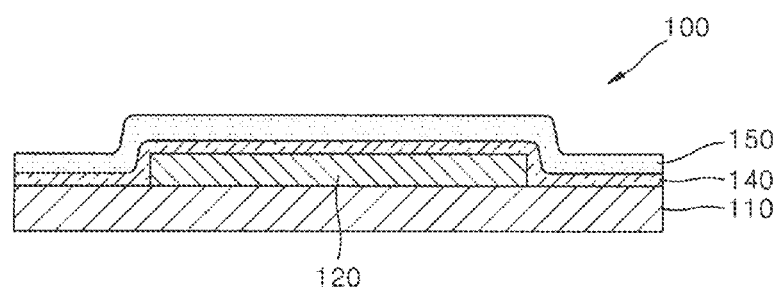
FIG. 1 is a schematic cross-sectional view of an organic light-emitting display apparatus according to an embodiment of the present invention.

The present invention will now be described more fully with reference to the accompanying drawings, in which exemplary embodiments of the invention are shown. Reference will now be made in detail to example embodiments, examples of which are illustrated in the accompanying drawings. However, example embodiments are not limited to the embodiments illustrated hereinafter, and the embodiments herein are rather introduced to provide easy and complete understanding of the scope and spirit of example embodiments. The terminology used herein is for the purpose of describing particular embodiments only and is not intended to be limiting of example embodiments. As used herein, the singular forms "a," "an" and "the" are intended to include the plural forms as well, unless the context clearly indicates otherwise.

It will be further understood that the terms "comprises" and/or "comprising" used herein specify the presence of stated components, steps, and/or devices, but do not preclude the presence or addition of one or more other components, steps, and/or devices. It will be understood that, although the terms 'first', 'second', etc. may be used herein to describe various elements, these elements should not be limited by these terms. That is, these terms are only used to distinguish one element from another element.

In the drawings, the thicknesses of layers and regions are exaggerated for clarity, and the same elements are denoted by the same reference numerals. It will be understood that when a portion such as a layer, a film, a region, or a board is referred to as being "on" an other portion, it can be directly on the other portion or on intervening portions.

Figure 2:
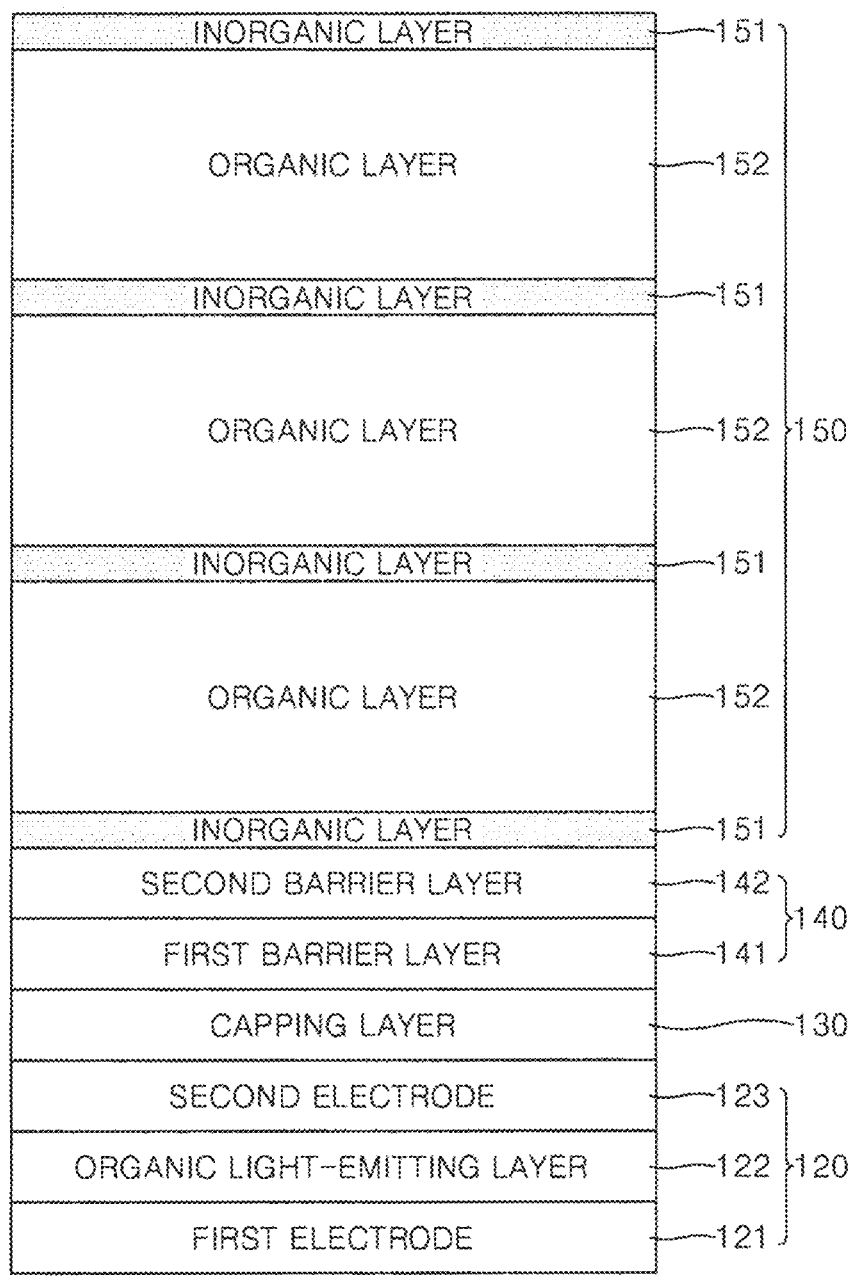
FIG. 2 is a schematic cross-sectional view of the organic light-emitting display apparatus of FIG. 1.

FIG. 1 is a schematic cross-sectional view of an organic light-emitting display apparatus 100 according to an embodiment of the present invention. FIG. 2 is a schematic cross-sectional view of the organic light-emitting display apparatus 100 of FIG. 1.

Referring to FIGS. 1 and 2, the organic light-emitting display apparatus 100 includes a substrate 110, an organic light-emitting device 120 formed on the substrate 110, a thin film encapsulation layer 150, and a barrier layer 140 interposed between the organic light-emitting device 120 and the thin film encapsulation layer 150.

The substrate 110 may be a flexible substrate and may be formed of plastic having excellent heat resistance and durability. For example, the substrate 110 may include a material selected from the group consisting of polyethersulphone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate, cellulose acetate propionate (CAP), poly(arylene ether sulfone), and combinations thereof. However, the present invention is not limited thereto, and the substrate 110 may be formed of various suitable materials such as metal or glass.

Although not illustrated, a device/wiring layer may be disposed on the substrate 110, and may include a driving thin film transistor (TFT) for driving the organic light-emitting device 120, a switching TFT, a capacitor, and wirings connected to the TFTs or the capacitor.

The organic light-emitting device 120 is formed on the substrate 110 and may include a first electrode 121, an organic light-emitting layer 122 formed on the first electrode 121, and a second electrode 123 formed on the organic light-emitting layer 122.

The first electrode 121 may be an anode that functions as a pixel electrode and may be patterned for respective red, green, and blue sub-pixels. The first electrode 121 may be formed of a material having excellent conductivity and may include a known material for forming the first electrode 121. Examples of the material for forming the first electrode 121 may include, but are not limited to, lithium (Li), magnesium (Mg), aluminum (Al), silver (Ag), aluminum-lithium (Al—

Li), calcium (Ca), magnesium-indium (Mg—In), magnesium-silver (Mg—Ag), calcium-aluminum (Ca—Al), indium tin oxide (ITO), indium zinc oxide (IZO), and zinc oxide (ZnO). The first electrode 121 may be a transparent electrode, a semi-transparent electrode, or a reflective electrode. The first electrode 121 may be changed in various suitable ways, and for example, may be configured to have two or more layers formed of two or more different materials.

The second electrode 123 may be an opposite electrode and may be a cathode. The second electrode 123 may be formed of a metal thin film having a low work function, including Li, Ca, LiF/Ca, LiF/Al, Al, Ag, Mg, or a compound thereof. In addition, the second electrode 123 may be a transparent electrode or a semi-transparent electrode, which is formed of ITO, IZO, ZnO, $In_2O_3$, or the like.

According to the present embodiment, the first electrode 121 may be an anode and the second electrode 123 may be a cathode. However, the present invention is not limited thereto. According to a driving method of the organic light-emitting display apparatus 100, the first electrode 121 may be a cathode and the second electrode 123 may be an anode. Holes and electrons are injected into the organic light-emitting layer 122 from the first electrode 121 and the second electrode 123, respectively. Light is emitted when excitons generated by combining the injected holes and electrons drop to a ground state from an excited state.

The organic light-emitting layer 122 may include various known light-emitting materials. Examples of the light-emitting material may include, but are not limited to, oxadiazole dimer dyes (Bis-DAPOXP), spiro compounds (Spiro-DPVBi, Spiro-6P), triarylamine compounds, bis(styryl) amine (DPVBi, DSA), 4,4"-bis(9-ethyl-3-carbazovinylene)-1,1"-biphenyle (BCzVBi), perylene, 2,5,8,11-tetra-tert-butylperylene (TBPe), 9H-carbazole-3,3"-(1,4-phenylene-di-2,1-ethene-diyl)bis[9-ethyl-(9C)] (BCzVB), 4,4-bis[4-(di-p-tolylamino)styryl]biphenyl (DPAVBi), 4-(di-p-tolylamino)-4"-[(di-p-tolylamino)styryl]stilbene (DPAVB), 4,4"-bis[4-(diphenylamino)styryl]biphenyl (BDAVBi), and bis(3,5-difluoro-2-(2-pyridyl)phenyl-(2-carboxypyridyl)iridium III (FlrPic) (which have a blue color); 3-(2-benzothiazolyl)-7-(diethylamino)coumarin (Coumarin 6), 2,3,6,7-tetrahydro-1,1,7,7,-tetramethyl-1H,5H,11H-10-(2-benzothiazolyl)quinolizino-[9,9a,1gh]coumarin (C545T), N,N'-dimethyl-quinacridone (DMQA), and (tris(2-phenylpyridine)iridium(III) ($Ir(ppy)_3$) (which have a green color); and tetraphenylnaphthacene (Rubrene), tris(1-phenyl isoquinoline)iridium(III) ($Ir(piq)_3$), bis(2-benzo[b]thiophen-2-il-pyrydine) (acetylacetonate)iridium(III) ($Ir(btp)_2(acac)$), tris (dibenzoylmethane)phenanthroline europium(III) ($Eu(dbm)_3(phen)$), tris[4,4'-di-tert-butyl-(2,2')-bipyridin]ruthenium (III) complex ($Ru(dtb-bpy)_3*2(PF_6)$), DCM1, DCM2, europium(thenoyltrifluoroacetone)3 (Eu(TTA)3), and butyl-6-(1,1,7,7-tetramethyljulolidyl-9-enyl)-4H-pyran (CJTB) (which have a red color). In addition, the light-emitting material may be a high molecular weight light-emitting material. For example, the light-emitting material may include, but is not limited to, an aromatic compound containing nitrogen and a polymer such as a phenylene-based polymer, a phenylene vinylene-based polymer, a thiophene-based polymer, a fluorine-based polymer, or a spiro fluorene-based polymer.

In addition to the organic light-emitting layer 122, an intermediate layer such as a hole transport layer (HTL), a hole injection layer (HIL), an electron transport layer (ETL), and an electron injection layer (EIL) may be selectively disposed between the first electrode 121 and the second electrode 123.

A capping layer 130 may be formed on the organic light-emitting device 120 and may protect the organic light-emitting device 120. In addition, the capping layer 130 may reduce resistance of the second electrode 123. The capping layer 130 may include an organic material, an inorganic material, or a mixture thereof.

The thin film encapsulation layer 150 is formed on the organic light-emitting device 120 and may be adhered onto the substrate 110 so as to cover the organic light-emitting device 120. The thin film encapsulation layer 150 may be formed by alternately forming inorganic layers 151 and organic layers 152. In this case, the inorganic layers 151 may be disposed as the lowermost and uppermost layers of the thin film encapsulation layer 150.

The inorganic layers 151 may include an inorganic oxide. For example, the inorganic layers 151 may include one or more inorganic materials of $AlO_x$, $TiO_2$, $ZrO$, $SiO_2$, $AlON$, $SiON$, $ZnO$, and $Ta_2O_5$.

The organic layers 152 may include a polymer-based material. Examples of the polymer-based material may include an acryl-based resin, an epoxy-based resin, polyimide, and polyethylene. The organic layers 152 may reduce internal stress of the inorganic layers 151, may compensate for defects of the inorganic layers 151, and may planarize the inorganic layers 151.

According to the present embodiment, the inorganic layers 151 are stacked four times and the organic layers 152 are stacked three times. However, the present invention is not limited thereto. That is, the number of times the inorganic layers 151 and the organic layers 152 are alternately stacked is not limited.

The barrier layer 140 may be formed between the organic light-emitting device 120 and the thin film encapsulation layer 150, may improve the membranous properties of the thin film encapsulation layer 150, and may prevent defects due to progressive dark spots from being formed. To this end, the barrier layer 140 may include a first barrier layer 141 and a second barrier layer 142.

The first barrier layer 141 may be formed on the organic light-emitting device 120. The capping layer 130 may be formed between the first barrier layer 141 and the organic light-emitting device 120. The first barrier layer 141 may be formed on the capping layer 130. Both the first barrier layer 141 and the second barrier layer 142 may protect the organic light-emitting layer 122 during formation of the thin film encapsulation layer 150.

The first barrier layer 141 may be formed of an alkali metal-containing compound. An example of the alkali metal-containing compound may include lithium fluoride (LiF). Alternatively, CsF, NaF, $Li_2O$, or the like may be used.

The first barrier layer 141 may be formed to have a thickness of about 100 Å to about 3000 Å. When the thickness of the first barrier layer 141 is smaller than 100 Å, a function of the first barrier layer 141, that is, a function of preventing the organic light-emitting layer 122 from deteriorating may not be sufficiently performed. When the thickness of the first barrier layer 141 is greater than 3000 Å, a large amount of stress is exerted on the first barrier layer 141, and thus, the first barrier layer 141 may be easily delaminated.

The second barrier layer 142 is formed on the first barrier layer 141 and is formed below the thin film encapsulation layer 150. An upper surface of the second barrier layer 142 may directly contact a lower surface of the thin film encapsulation layer 150. The second barrier layer 142 may be disposed directly below the thin film encapsulation layer 150, and thus, the membranous properties of the thin film encapsulation layer 150 formed on the second barrier layer 142 may be improved. In addition, high energy oxygen particles formed during formation of the inorganic layers 151, including an inorganic oxide, may be effectively prevented from penetrating into the inorganic layers 151.

The second barrier layer 142 may include an amorphous inorganic oxide. For example, the second barrier layer 142 may include at least one selected from the group consisting of SiO, $TiO_x$, $MoO_x$, ZnO, $ZnSnO_x$, and $AlO_xN_y$.

A region of the second barrier layer 142 may have a higher concentration of oxygen than other regions of the second barrier layer 142. For example, when the second barrier layer 142 is formed of SiO, the second barrier layer 142 may overall include SiO, but may partially/locally include $SiO_2$. This is because, during formation of the inorganic layers 151, high energy oxygen particles formed during formation of the inorganic layers 151 are captured by the second barrier layer 142 while being combined with the second barrier layer 142, as described in more detail below with reference to FIGS. 6A and 6B.

The second barrier layer 142 may have a thickness of about 10 Å to about 100 Å. When the thickness of the second barrier layer 142 is smaller than 10 Å, it is difficult to protect the organic light-emitting layer 122 from high energy particles formed during formation of the thin film encapsulation layer 150 and it is difficult to a control a process for forming the second barrier layer 142. When the thickness of the second barrier layer 142 is greater than 100 Å, light usage efficiency is reduced by as much as about 10%, thereby reducing luminescent efficiency. When the thickness of the second barrier layer 142 is smaller than 10 Å, it is difficult to protect the organic light-emitting layer 122 from high energy particles formed during formation of the thin film encapsulation layer 150, which is confirmed as described with reference to FIGS. 6A and 6B. The problem that arises when the thickness of the second barrier layer 142 is greater than 100 Å according to one embodiment is confirmed from a detailed description with reference to FIGS. 8A through 8C, in particular, FIG. 8A.

Hereinafter, with reference to a comparative example, a function of the barrier layer 140 will be described in more detail.

Figure 3:
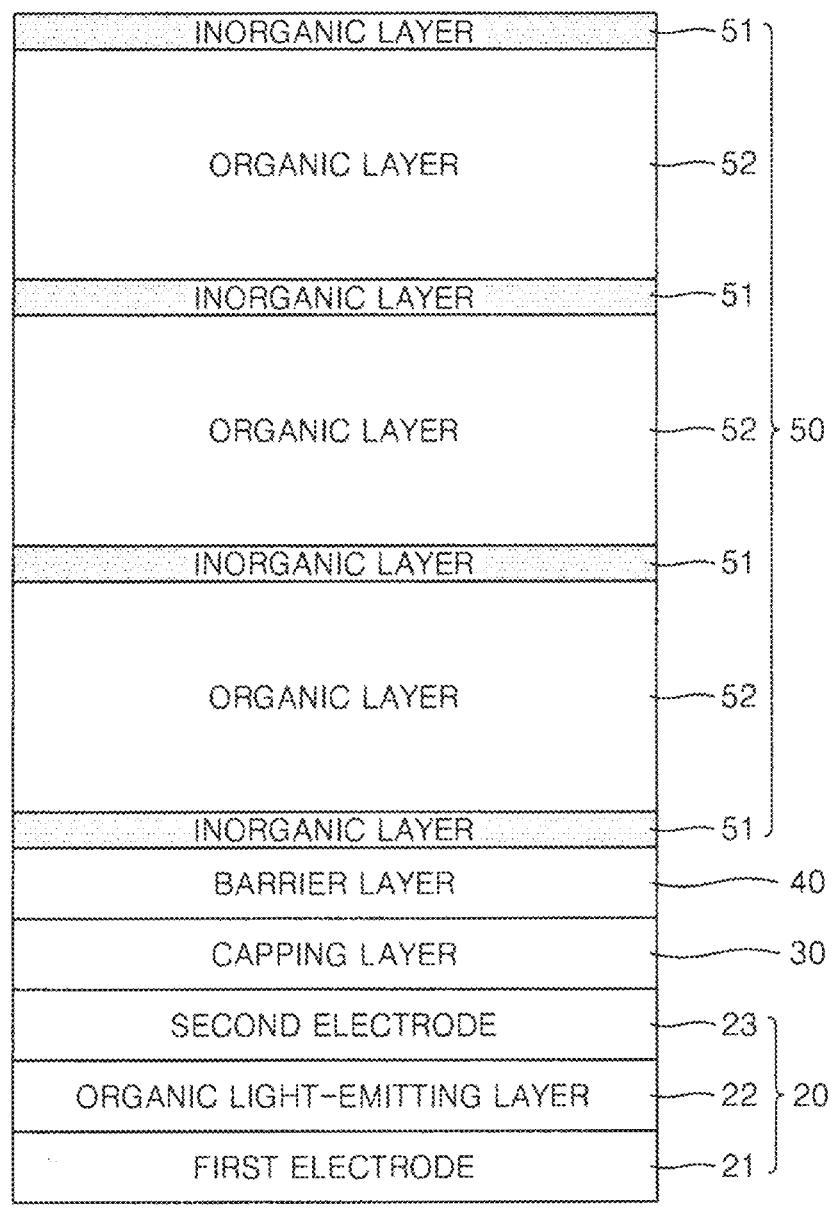
FIG. 3 is a schematic cross-sectional view of an organic light-emitting display apparatus according to a comparative example.

FIG. 3 is a schematic cross-sectional view of an organic light-emitting display apparatus according to a comparative example.

The organic light-emitting display apparatus according to the comparative example includes a substrate, an organic light-emitting device 20 formed on the substrate, a capping layer 30, a barrier layer 40, and a thin film encapsulation layer 50. The barrier layer 40 of FIG. 3 is substantially the same as the first barrier layer 141 of FIG. 2, except that the barrier layer 40 does not include the second barrier layer 142.

Hereinafter, for convenience of description, the case where the barrier layer 40 according to the comparative example is formed of LiF and the case where the barrier layer 140 according to an embodiment of the present invention includes the first barrier layer 141 formed of LiF and the second barrier layer 142 formed of SiO from among the amorphous inorganic oxides will be described.

Crystalline structures of the barrier layer 40 and the first barrier layer 141 will now be described.

Figure 4:
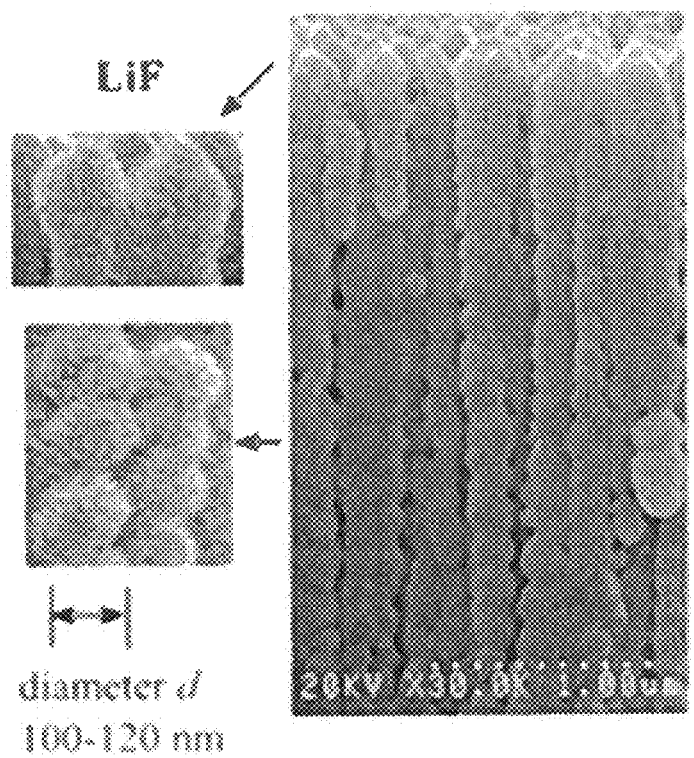
FIG. 4 is a scanning electron microscope (SEM) image of a barrier layer formed of lithium fluoride (LiF) shown in FIG. 3.

An image of the crystalline structure of LiF of the barrier layer 40 is shown in FIG. 4. FIG. 4 is a scanning electron microscope (SEM) image of the barrier layer 40 formed of LiF shown in FIG. 3. As shown in FIG. 4, the barrier layer 40 formed of LiF has a column structure.

Figure 5A:
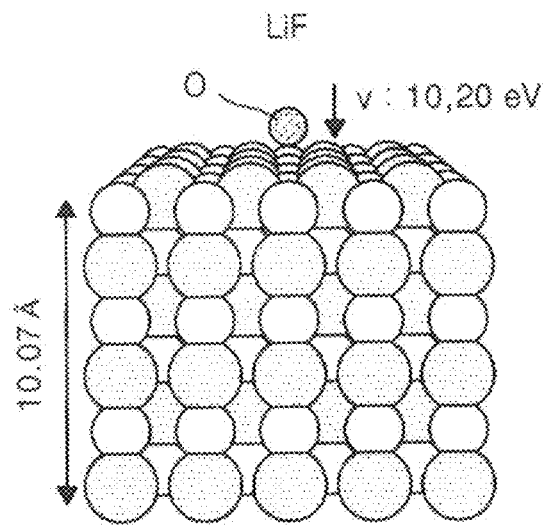
FIG. 5A is a schematic diagram of a crystalline diagram of a first barrier layer formed of LiF.
Figure 5B:
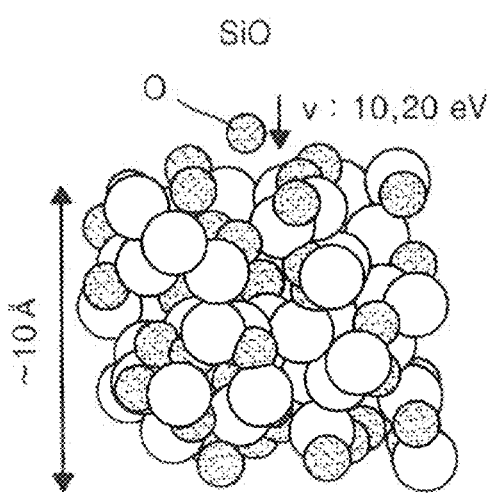
FIG. 5B is a schematic diagram of a crystalline diagram of a second barrier layer formed of SiO.

Crystalline structures of LiF and SiO of the barrier layer 140 are shown in FIGS. 5A and 5B. As shown in FIG. 5A, LiF of the first barrier layer 141 has a column structure like in FIG. 4, but SiO of the second barrier layer 142 has an amorphous structure. Since the barrier layer 140 includes the second barrier layer 142 formed of an amorphous inorganic oxide, high energy particles may be effectively prevented from being diffused, progressive dark spots may be effectively prevented from being formed, and the membranous properties of the inorganic layers 151 may be improved, as described below in more detail.

Prevention of Diffusion of High Energy Particles and Prevention of Progressive Dark Spots The inorganic layers 51 and 151 of the thin film encapsulation layers 50 and 150 are formed on the barrier layers 40 and 140, respectively. In this case, the inorganic layers 51 and 151 may include oxide. When the inorganic layer 151 is formed, high energy particles, for example, oxygen atoms formed during formation of the inorganic layers 51 and 151 may be introduced into the barrier layers 40 and 140. Behaviors of the oxygen atoms introduced into the barrier layers 40 and 140 are shown in the graphs of FIGS. 6A and 6B.

Figure 6A:
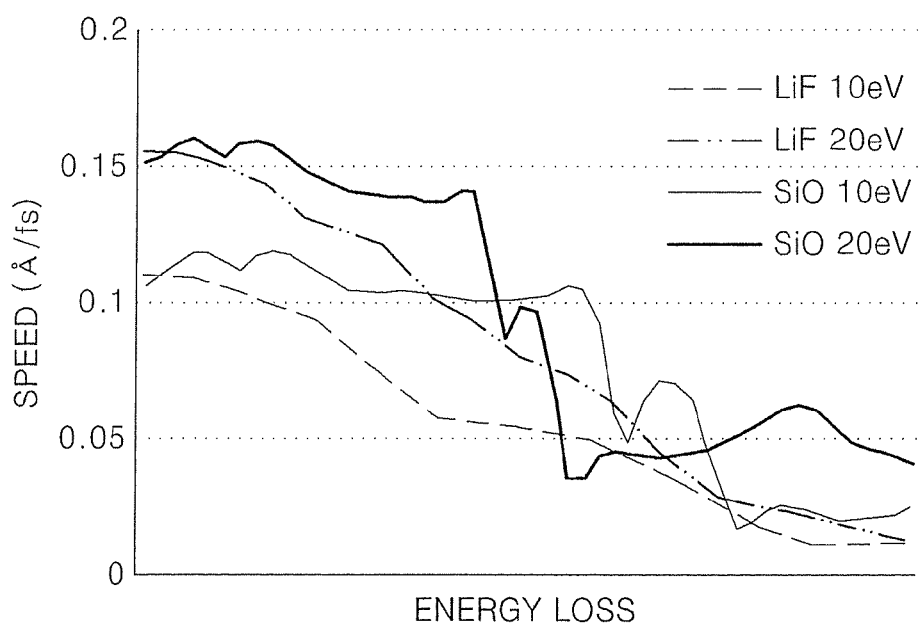
FIGS. 6A and 6B are graphs showing the behaviors of high-energy oxygen atoms introduced into a barrier layer, and that is.
Figure 6B:
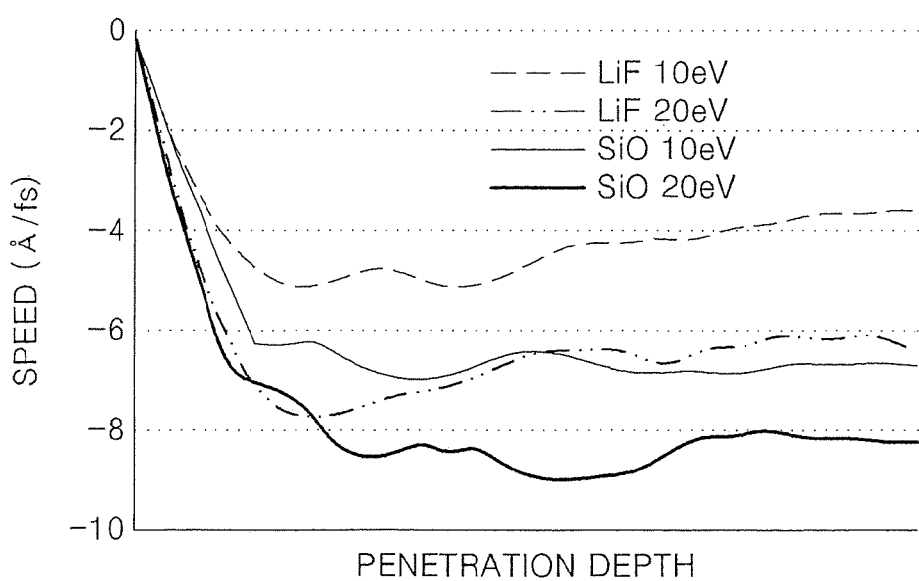

FIGS. 6A and 6B are graphs for explaining the behaviors of the oxygen atoms introduced into the barrier layers 40 and 140. That is, FIG. 6A is a graph showing a change in energy of oxygen atoms introduced into the barrier layer 40/141 formed of LiF and the second barrier layer 142 formed of SiO. FIG. 6B is a graph showing a depth to which the oxygen atoms penetrate into the barrier layer 40/141 formed of LiF and the second barrier layer 142 formed of SiO. In more detail, FIGS. 6A and 6B show the cases where the oxygen atoms introduced into the barrier layer 40/141 formed of LiF and the second barrier layer 142 formed of SiO have energies of 10 eV and 20 eV, respectively.

Referring to FIGS. 6A and 6B, when high energy oxygen atoms are introduced into the barrier layer 40 according to the comparative example, it may be confirmed that, as oxygen atoms contact a surface of LiF and then penetrate into LiF, a penetrating speed of the oxygen atoms is gradually reduced by friction due to Li and F atoms. In this case, the oxygen atoms are not chemically combined with adjacent Li and F atoms and wander in an interstitial site of a crystal lattice. At a sufficient temperature, the oxygen atoms introduced into the barrier layer 40 formed of LiF may be discharged out of the barrier layer 40 of LiF, that is, towards the capping layer 30 disposed below the barrier layer 40, and thus, progressive black spots may be formed.

However, the case where high energy oxygen particles are introduced into the barrier layer 140 according to an embodiment of the present invention is different from the comparative example.

Referring to FIGS. 6A and 6B, when high energy oxygen atoms are introduced into the barrier layer 140, the oxygen atoms first penetrate into the second barrier layer 142 formed of SiO. The oxygen atoms that penetrate into the second barrier layer 142 of SiO move freely in voids of a crystalline structure of SiO for a while. Then, the oxygen atoms lose their energy when they meet Si or O atoms and constitute a chemical combination with the Si or O atoms. Through the chemical combination, the oxygen atoms are captured in the second barrier layer 142, and $SiO_2$ is formed in the second barrier layer 142 such that the second barrier layer 142 partially/locally includes $SiO_2$. That is, the second barrier layer 142 may include SiO as a whole and may have a region where a concentration of O is high, that is, a region where $SiO_2$ is formed. Since $SiO_2$ has high light transmittance, an overall optical performance of the barrier layer 140 may be increased.

Thus, although the barrier layer 140 is exposed to a set or predetermined temperature, if the chemical combination of the oxygen atoms captured in the second barrier layer 142 is not dissolved, the oxygen atoms do not move toward the capping layer 130. In addition, even if the oxygen atoms captured in the second barrier layer 142 pass through the second barrier layer 142, since the first barrier layer 141 formed of LiF is disposed below the second barrier layer 142, the oxygen atoms may be effectively prevented from moving into an upper region of the first barrier layer 141.

The penetrating depths of the oxygen atoms will now be described with reference to FIG. 6B. A penetrating depth of the barrier layer formed of LiF is smaller than a penetrating depth of the barrier layer formed of SiO. However, the difference is not great. In order to prevent particles (oxygen particles) having energy of about 20 eV from moving, it is sufficient to form the barrier layer formed of SiO to have a thickness of about 1 nm (10 Å) or more.

As described with reference to FIGS. 6A and 6B, according to an embodiment of the present invention, since the barrier layer 140 includes the second barrier layer 142 formed of an amorphous inorganic oxide, high energy particles may be effectively prevented from being diffused during formation of the inorganic layers 151 after formation of the barrier layer 140. Accordingly, progressive black spots may be effectively prevented from being formed and the organic light-emitting layer 122 may be effectively prevented from being damaged due to the high energy particles.

Improvement of the Membranous Properties of Inorganic Layers 151

In addition, since the barrier layer 140 according to an embodiment of the present invention includes the second barrier layer 142 formed of an amorphous inorganic oxide, the membranous properties of the inorganic layers 151 may be improved. Hereinafter, the effect of improving the membranous properties of the inorganic layers 151 will be described with reference to FIG. 7.

Figure 7:
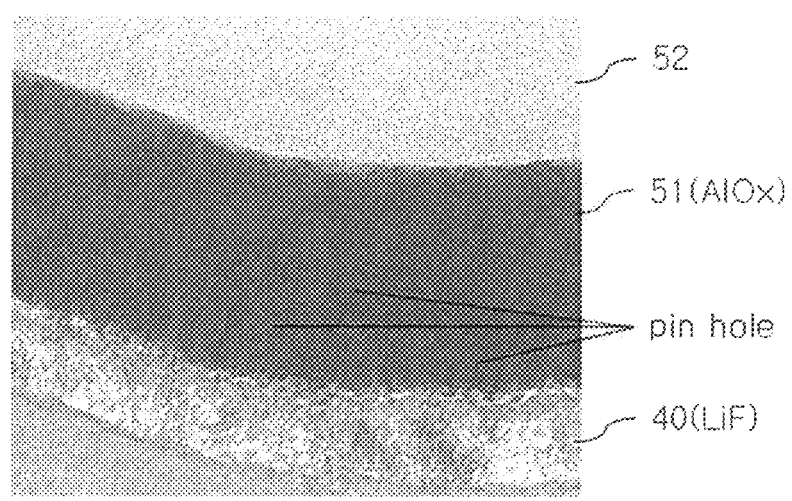
FIG. 7 is an SEM image of a case where an inorganic layer is formed on a barrier layer according to the comparative example.

FIG. 7 is an SEM image of a case where the inorganic layer 51 is formed on the barrier layer 40 according to the comparative example.

Referring to FIG. 7, when the inorganic layer 51 of $AlO_x$ is formed on the barrier layer 40 of LiF, it is confirmed that a plurality of pin holes are formed in the inorganic layer 51. It is expected that the pin holes are formed due to the influence of the barrier layer 40 formed of LiF shown in FIG. 4. That is, the inorganic layer 51 formed on the barrier layer 40 of LiF having a column structure is affected by the column structure of LiF, and thus, a plurality of pin holes may be formed in the inorganic layer 51.

However, the barrier layer 140 according to an embodiment of the present invention includes the second barrier layer 142 that is formed between the inorganic layer 151 and the first barrier layer 141 of LiF and has an amorphous structure, and thus, pin holes may be effectively prevented from being formed to thus improve the membranous properties of the inorganic layers 151.

Since the second barrier layer 142 has an amorphous crystalline structure, a crystalline structure of the inorganic layers 151 may not be originally affected by the first barrier layer 141 having a column structure. In addition, since the second barrier layer 142 has an amorphous crystalline structure, instead of a column structure, pin holes may be effectively prevented from being formed in a thickness direction in the inorganic layers 151.

When the inorganic layer 151 is formed via atomic layer deposition (ALD), trimethyl aluminum (TMA) may be used. In this case, when adhesion energies of TMA are calculated, adhesion energy of TMA with respect to LiF is 0.18 eV and adhesion energy of TMA with respect to SiO is 1.32 eV, which is 7.3 times higher than adhesion energy of TMA with respect to LiF. Thus, when the inorganic layers 151 are formed on the second barrier layer 142 including SiO, the membranous properties of the inorganic layers 151 may be further improved.

The second barrier layer 142, including an amorphous inorganic oxide, has the above-described advantages. However, as the thickness of the second barrier layer 142 increases, light efficiency is reduced. Thus, the second barrier layer 142 is not the only component of the barrier layer 140, as described below.

Figure 8A:
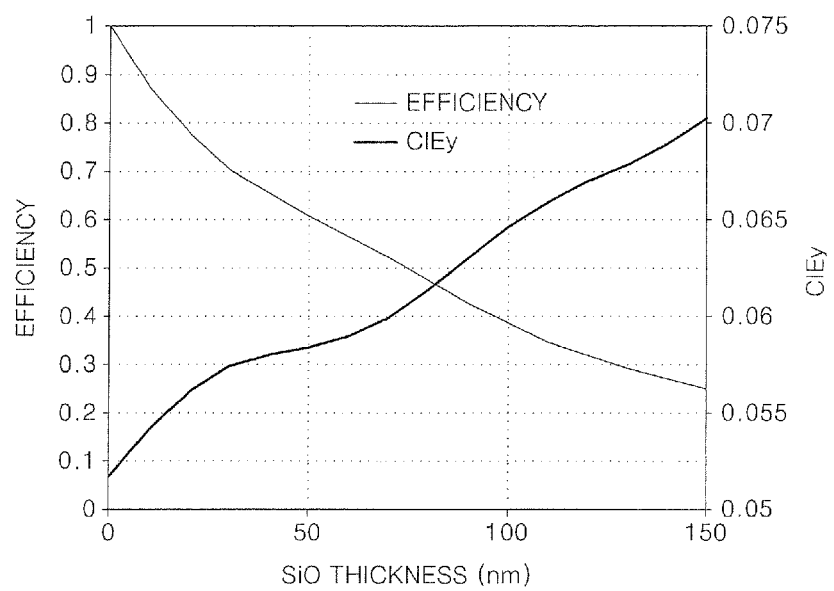
FIG. 8A is a graph of efficiency of a blue device and a y coordinate value (CiEy) of CIE 1931 color coordinates according to the thickness of a second barrier layer formed of SiO.
Figure 8B:
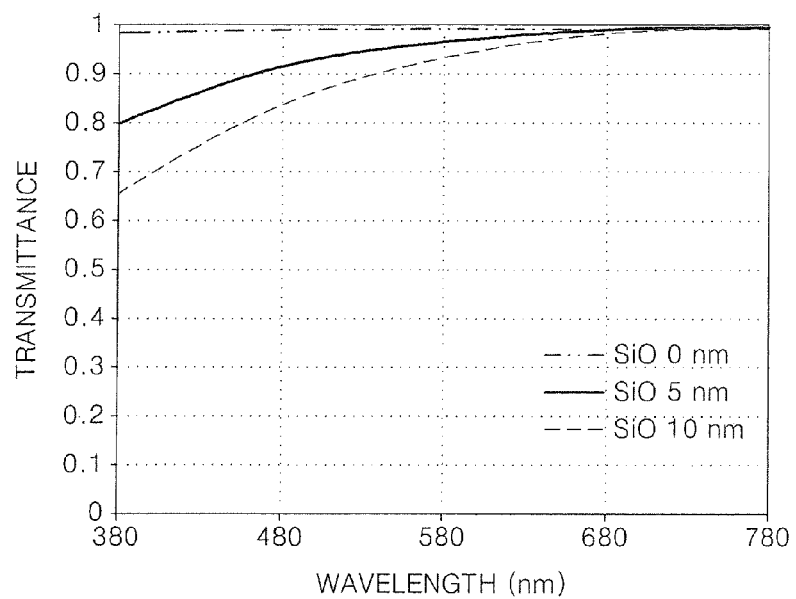
FIGS. 8B and 8C are graphs of transmittance and reflectivity according to the thickness of the second barrier layer of SiO.
Figure 8C:
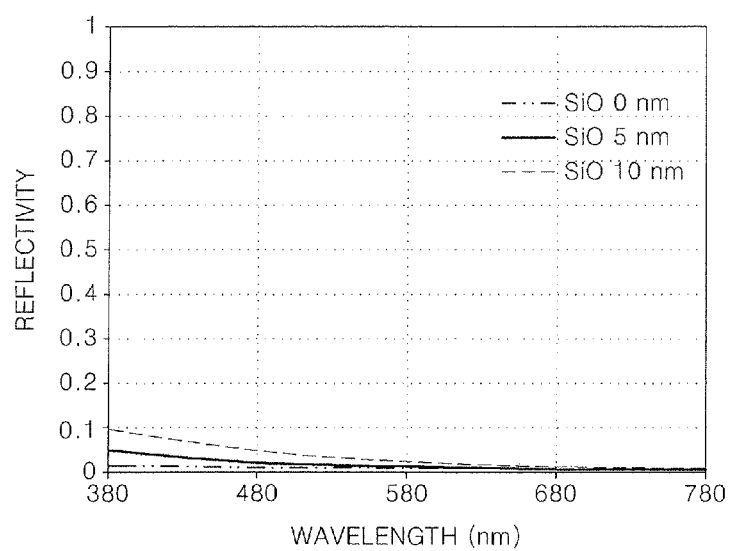

FIG. 8A is a graph of efficiency of a blue device/pixel and a y coordinate value (CiEy) of CIE 1931 color coordinates according to the thickness of the second barrier layer 142 formed of SiO. FIGS. 8B and 8C are graphs of transmittance and reflectivity according to the thickness of the second barrier layer 142 of SiO. Among red, green, and blue light-emitting devices/pixels included in the organic light-emitting device 120, a reduction of the efficiency of the blue light-emitting device/pixel is relatively high. Thus, FIG. 8A shows the case of the blue device/pixel. FIGS. 8A through 8C show the case where the second barrier layer 142 is formed on the first barrier layer 141 that has a thickness of about 500 Å and is formed of LiF.

Referring to FIGS. 8A through 8C, as the thickness of the second barrier layer 142 formed of SiO is increased, the efficiency of the blue device is gradually reduced, CiEy is increased, and transmittance and reflectivity are reduced. As CiEy is reduced, light emitted from the blue device/pixel is closer to a target color, that is, a blue color. Referring to FIG. 8A, in particular, when the thickness of the second barrier layer 142 formed of SiO is about 10 nm (100 Å), the efficiency is reduced by as much as 10%. That is, as the thickness of the second barrier layer 142 is reduced, the organic light-emitting display apparatus 100 is more optically advantageous. Thus, in order to prevent high energy particles from penetrating while still having desired optical conditions, the barrier layer 140 may include both of the second barrier layer 142 and the first barrier layer 141.

Hereinafter, a method of manufacturing the organic light-emitting display apparatus 100 will be described.

Figure 9:
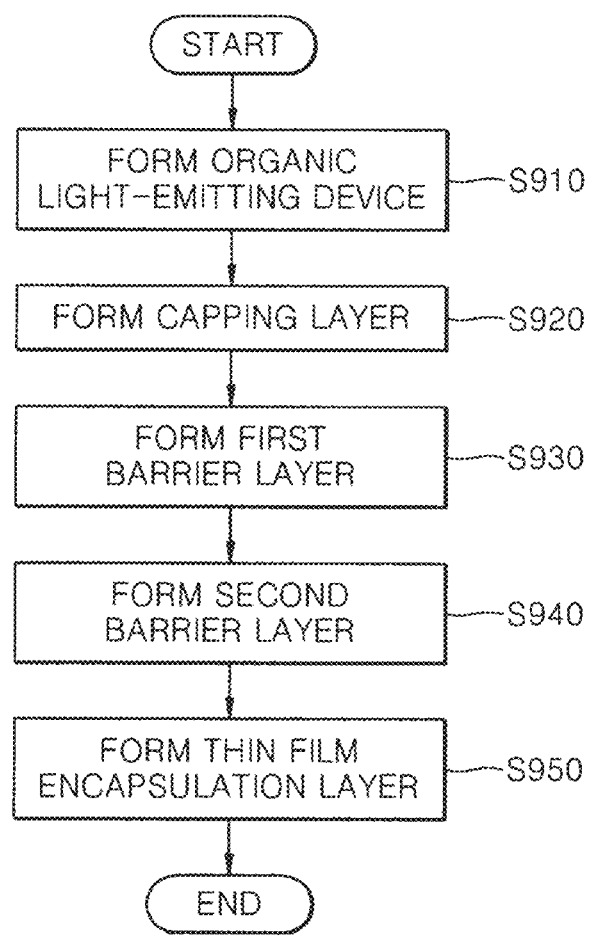
FIG. 9 is a flowchart of a method of manufacturing the organic light-emitting display apparatus of FIG. 1, according to an embodiment of the present invention.

FIG. 9 is a flowchart of a method of manufacturing the organic light-emitting display apparatus 100, according to an embodiment of the present invention.

Referring to FIG. 9, in operation S910, the organic light-emitting device 120 is formed on the substrate 110. The substrate 110 may be a flexible substrate and may be formed of plastic including a polymer having excellent heat resistance and durability. The flexible substrate may be disposed on a support substrate that supports the flexible substrate and includes glass or the like. The support substrate may be removed after all processes are performed or during the processes.

The organic light-emitting device 120 may include the first electrode 121, the organic light-emitting layer 122, and the second electrode 123; and may be formed via known methods.

The first electrode 121 may be a reflective electrode, and the second electrode 123 may be a transparent or semi-transparent electrode. Thus, light generated from the organic light-emitting layer 122 may be emitted directly toward the second electrode 123 or may be reflected off the first electrode 121 and then emitted. In this case, the second electrode 123 is formed to be a semi-transparent electrode, a resonance structure may be formed by the first electrode 121 and the second electrode 123.

The organic light-emitting layer 122 may be formed of a low molecular weight light-emitting material or a high molecular weight light-emitting material. Examples of these materials have been described above. Of course, the above-described intermediate layer in addition to the organic light-emitting layer 122 may be selectively formed between the first electrode 121 and the second electrode 123.

In addition, a device/wiring layer for driving the organic light-emitting device 120 may be further formed on the substrate 110. The device/wiring layer may include a driving TFT for driving the organic light-emitting device 120, a switching TFT, a capacitor, and wirings connected to the TFTs or the capacitor.

In operation S920, the capping layer 130 is formed.

The capping layer 130 may be formed on the organic light-emitting device 120, that is, on the second electrode 123. The capping layer 130 may include an organic material, an inorganic material, or mixtures thereof. Examples of these have been described above.

In operation S930, the first barrier layer 141 is formed.

The first barrier layer 141 may be formed of an alkali metal-containing compound. An example of the alkali metal-containing compound may include LiF. Alternatively, CsF, NaF, or $Li_2O$ may be used. The first barrier layer 141 may be formed via thermal evaporation. Since the first barrier layer 141 is formed via thermal evaporation, other organic layers may be effectively prevented from being damaged.

The first barrier layer 141 may be formed to have a thickness of about 100 Å to about 3000 Å. When the thickness of the first barrier layer 141 is smaller than 100 Å, a function of the first barrier layer 141, that is, a function of preventing the organic light-emitting layer 122 from deteriorating may not be sufficiently performed. When the thickness of the first barrier layer 141 is greater than 3000 Å, a large amount of stress is exerted on the first barrier layer 141, and thus, the first barrier layer 141 may be easily delaminated.

In operation S940, the second barrier layer 142 is formed.

The second barrier layer 142 may be formed on the first barrier layer 141 and may be formed of an amorphous inorganic oxide. For example, the second barrier layer 142 may include at least one selected from the group consisting of SiO, $TiO_x$, $MoO_x$, ZnO, $ZnSnO_x$, and $AlO_xN_y$. The second barrier layer 142 may be formed via thermal evaporation.

The second barrier layer 142 may be formed to have a thickness of about 10 Å to about 100 Å. When the thickness of the second barrier layer 142 is smaller than 10 Å, it is difficult to protect the organic light-emitting layer 122 from high energy particles and it is difficult to a control a process for forming the second barrier layer 142, as described with reference to FIGS. 6A and 6B. When the thickness of the second barrier layer 142 is greater than 100 Å, optical performance is dramatically reduced, thereby reducing luminescent efficiency, as described with reference to FIGS. 8A through 8C.

In operation S950, the thin film encapsulation layer 150 is formed.

First, the inorganic layer 151 may be formed on the second barrier layer 142. The inorganic layer 151 may be formed of an inorganic oxide. For example, the inorganic layers 151 may include one or more inorganic materials selected from $AlO_x$, $TiO_2$, ZrO, $SiO_2$, AlON, SiON, ZnO, and $Ta_2O_5$. The inorganic layers 151 may be formed via plasma deposition or ALD.

In particular, as described above, since adhesion energy of TMA with respect to SiO, which is used in ALD, is relatively high, when the inorganic layer 151 is formed via ALD, the membranous properties of the inorganic layer 151 are further improved.

Then, the organic layer 152 may be formed on the inorganic layer 151. Examples of the polymer-based material may include an acryl-based resin, an epoxy-based resin, polyimide, and polyethylene. The organic layers 152 may reduce internal stress of the inorganic layers 151, may compensate for defects of the inorganic layers 151, and may planarize the inorganic layers 151.

Figure 10:
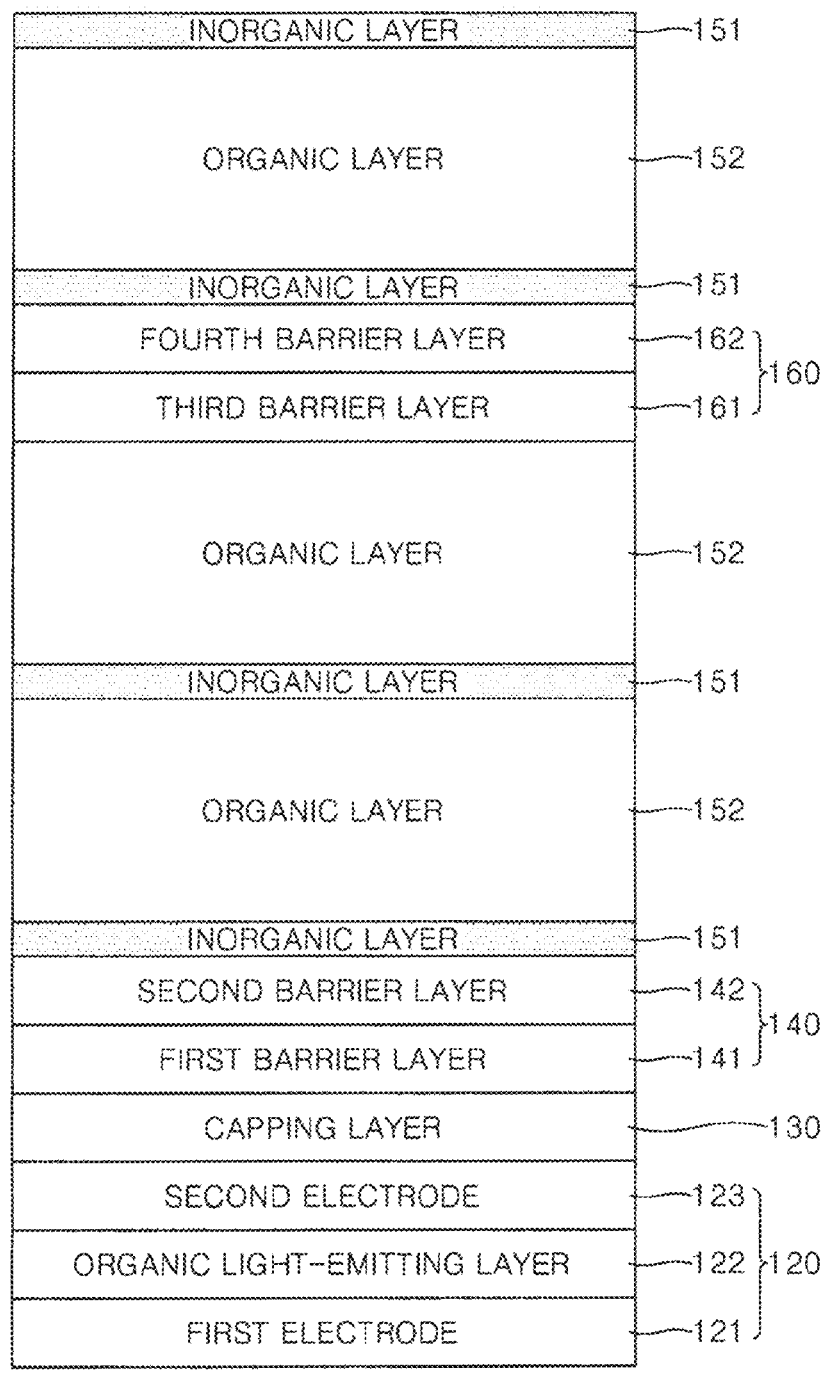
FIG. 10 is a schematic cross-sectional view of an organic light-emitting display apparatus according to another embodiment of the present invention.

FIG. 10 is a schematic cross-sectional view of an organic light-emitting display apparatus according to another embodiment of the present invention.

Referring to FIG. 10, the organic light-emitting display apparatus according to the present embodiment may also include the organic light-emitting device 120, the thin film encapsulation layer 150, and the barrier layer 140 disposed between the organic light-emitting device 120 and the thin film encapsulation layer 150. The barrier layer 140 disposed below the thin film encapsulation layer 150 includes the first barrier layer 141 and the second barrier layer 142. Detailed structures of the components are the same as those described with respect to FIGS. 1 and 2.

However, according to the present embodiment, the organic light-emitting display apparatus of FIG. 10 is different from the organic light-emitting display apparatus of FIGS. 1 and 2 in that the organic light-emitting display apparatus of FIG. 10 further includes a barrier layer 160 disposed below the inorganic layer 151 disposed in the middle of the thin film encapsulation layer 150, which is an organic/inorganic complex layer.

The barrier layer 160 may include a third barrier layer 161 and a fourth barrier layer 162 and may be disposed at any portion below the inorganic layers 151. The third barrier layer 161 is substantially the same as the first barrier layer 141 and the fourth barrier layer 162 is substantially the same as the second barrier layer 142. Thus, the detailed descriptions of the first and second barrier layers 141 and 142 are applied to the third and fourth barrier layers 161 and 162.

Since the barrier layer 160 is disposed below the inorganic layer 151, the organic light-emitting layer 122 may be effectively protected from high energy particles, progressive black spots may be effectively prevented from being formed, and the membranous properties of the inorganic layer 151 may be effectively improved, as described above.

According to the present embodiment, the barrier layer 160 is formed below the third inorganic layer 151, but the present invention is not limited thereto. Alternatively, the barrier layer 160 may be disposed below the second or fourth inorganic layer 151.

According to the embodiments of the present invention, due to the presence of a first barrier layer and a second barrier layer formed of an amorphous inorganic oxide, the membranous properties of a thin film encapsulation layer may be improved and defects due to progressive black spots may be effectively prevented.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. An organic light-emitting display apparatus comprising:
   a substrate;
   an organic light-emitting device on the substrate;
   a thin film encapsulation layer on the organic light-emitting device and covering the organic light-emitting device; and a barrier layer between the organic light-emitting device and the thin film encapsulation layer,
wherein the barrier layer comprises: a first barrier layer on the organic light-emitting device and comprising an alkali metal-containing compound; and a second barrier layer between the first barrier layer and the thin film encapsulation layer and comprising an amorphous inorganic oxide.

2. The organic light-emitting display apparatus of claim 1, wherein the second barrier layer is disposed directly below the thin film encapsulation layer such that an upper surface of the second barrier layer directly contacts a lower surface of the thin film encapsulation layer.

3. The organic light-emitting display apparatus of claim 1, wherein the second barrier layer is disposed directly on the first barrier layer.

4. The organic light-emitting display apparatus of claim 1, wherein the first barrier layer comprises lithium fluoride (LiF).

5. The organic light-emitting display apparatus of claim 1, wherein the second barrier layer comprises at least one selected from the group consisting of SiO, $TiO_x$, $MoO_x$, ZnO, $ZnSnO_x$, and $AlO_xN_y$.

6. The organic light-emitting display apparatus of claim 1, wherein the second barrier layer has a region having a higher concentration of oxygen than other regions thereof.

7. The organic light-emitting display apparatus of claim 1, wherein the thin film encapsulation layer comprises a plurality of inorganic layers and organic layers disposed between the plurality of inorganic layers, and
wherein the inorganic layers comprise an inorganic oxide.

8. The organic light-emitting display apparatus of claim 7, wherein a lowermost layer of the thin film encapsulation layer is an inorganic layer of the inorganic layers, and
wherein the second barrier layer is disposed below the inorganic layer.

9. The organic light-emitting display apparatus of claim 7, further comprising:
a third barrier layer disposed directly below at least one of the plurality of inorganic layers and comprising an alkali metal-containing compound; and
a fourth barrier layer on the third barrier layer and comprising an amorphous inorganic oxide.

10. The organic light-emitting display apparatus of claim 1, wherein the first barrier layer has a thickness of about 100 Å to about 3000 Å.

11. The organic light-emitting display apparatus of claim 1, wherein the second barrier layer has a thickness of about 10 Å to about 100 Å.

12. An organic light-emitting display apparatus comprising:
a substrate;
a first electrode on the substrate;
an organic light-emitting device on the first electrode;
a second electrode on the organic light-emitting device;
a thin film encapsulation layer disposed on the second electrode so as to cover the first electrode, the organic light-emitting device, and the second electrode, and comprising inorganic layers and organic layers disposed between the inorganic layers; and
a barrier layer disposed below the inorganic layer,
wherein the barrier layer comprises: a first barrier layer comprising an alkali metal-containing compound; and a second barrier layer between the first barrier layer and the inorganic layer and comprising an amorphous inorganic oxide.

13. The organic light-emitting display apparatus of claim 12, wherein the first barrier layer comprises LiF.

14. The organic light-emitting display apparatus of claim 12, wherein the second barrier layer comprises at least one selected from the group consisting of SiO, $TiO_x$, $MoO_x$, ZnO, $ZnSnO_x$, and $AlO_xN_y$.

15. The organic light-emitting display apparatus of claim 12, wherein the second barrier layer has a region having a higher concentration of oxygen than other regions thereof.

16. The organic light-emitting display apparatus of claim 12, wherein the second barrier layer is disposed directly below the inorganic layer, and
wherein the inorganic layer comprises an inorganic oxide.

17. The organic light-emitting display apparatus of claim 12, wherein the second barrier layer has a thickness of about 10 Å to about 100 Å.

18. A method of manufacturing an organic light-emitting display apparatus, the method comprising:
forming an organic light-emitting device on a substrate;
forming a thin film encapsulation layer to cover the organic light-emitting device; and
forming a barrier layer between the organic light-emitting device and the thin film encapsulation layer,
wherein the forming of the barrier layer comprises:
forming a first barrier layer comprising an alkali metal-containing compound on the organic light-emitting device; and
forming a second barrier layer comprising an amorphous inorganic oxide between the first barrier layer and the thin film encapsulation layer.

19. The method of claim 18, wherein the forming of the thin film encapsulation layer comprises:
forming an inorganic layer comprising an inorganic oxide; and
forming an organic layer on the inorganic layer.

20. The method of claim 19, wherein the inorganic layer is formed via plasma deposition or atomic layer deposition (ALD).

21. The method of claim 18, wherein the first barrier layer comprises lithium fluoride (LiF).

22. The method of claim 21, wherein the forming of the first barrier layer utilizes a thermal evaporation process.

23. The method of claim 18, wherein the second barrier layer comprises at least one selected from the group consisting of SiO, $TiO_x$, $MoO_x$, ZnO, $ZnSnO_x$, and $AlO_xN_y$.

24. The method of claim 23, wherein the forming of the second barrier layer utilizes a thermal evaporation process.

25. The method of claim 18, wherein the first barrier layer has a thickness of about 100 Å to about 3000 Å.

26. The method of claim 18, wherein the second barrier layer has a thickness of about 10 Å to about 100 Å.

* * * * *